(12) United States Patent
Huang

(10) Patent No.: US 9,673,152 B2
(45) Date of Patent: Jun. 6, 2017

(54) HIGH-FREQUENCY PACKAGE

(71) Applicant: WIN Semiconductors Corp., Tao Yuan (TW)

(72) Inventor: Chih-Wen Huang, Taoyuan (TW)

(73) Assignee: WIN Semiconductors Corp., Tao Yuan (TW)

( * ) Notice: Subject to any disclaimer, the term of this patent is extended or adjusted under 35 U.S.C. 154(b) by 0 days.

(21) Appl. No.: 14/883,635

(22) Filed: Oct. 15, 2015

(65) Prior Publication Data
US 2017/0047292 A1 Feb. 16, 2017

Related U.S. Application Data

(60) Provisional application No. 62/204,972, filed on Aug. 13, 2015.

(51) Int. Cl.
*H01L 23/552* (2006.01)
*H01L 23/66* (2006.01)
*H01L 23/00* (2006.01)
*H01L 23/495* (2006.01)

(52) U.S. Cl.
CPC ........ *H01L 23/552* (2013.01); *H01L 23/4952* (2013.01); *H01L 23/49503* (2013.01); *H01L 23/49541* (2013.01); *H01L 23/49548* (2013.01); *H01L 23/66* (2013.01); *H01L 24/49* (2013.01); *H01L 2223/6611* (2013.01); *H01L 2223/6638* (2013.01); *H01L 2224/48247* (2013.01); *H01L 2924/30107* (2013.01)

(58) Field of Classification Search
CPC . H01L 23/552; H01L 23/66; H01L 23/49503; H01L 23/4952; H01L 23/49541
See application file for complete search history.

(56) References Cited

U.S. PATENT DOCUMENTS

| | | | |
|---|---|---|---|
| 5,057,805 A | 10/1991 | Kadowaki | |
| 5,677,570 A * | 10/1997 | Kondoh | H01L 23/49503 257/690 |
| 5,808,325 A * | 9/1998 | Webb | H01L 25/167 257/100 |
| 5,932,927 A | 8/1999 | Koizumi | |
| 6,239,669 B1 | 5/2001 | Koriyama | |
| 6,642,808 B2 | 11/2003 | Koriyama | |
| 6,661,101 B2 | 12/2003 | Hiraga | |
| 6,828,658 B2 | 12/2004 | Schmitz | |
| 6,936,921 B2 | 8/2005 | Yoshida | |
| 7,187,256 B2 | 3/2007 | Oran | |
| 7,211,887 B2 | 5/2007 | Channabasappa | |
| 7,489,022 B2 | 2/2009 | Torkington | |

(Continued)

FOREIGN PATENT DOCUMENTS

| | | |
|---|---|---|
| TW | 200504964 | 2/2005 |
| TW | 200522318 | 7/2005 |

(Continued)

*Primary Examiner* — Victor A Mandala
(74) *Attorney, Agent, or Firm* — Winston Hsu; Scott Margo

(57) ABSTRACT

A high-frequency package comprises a ground lead occupying a side of the high-frequency package; and a signal lead comprising at least a protrusion protruding from a central portion of the signal lead; wherein the ground lead and the signal lead perform as a transmission line, and the at least a protrusion forms capacitance of the transmission line.

16 Claims, 15 Drawing Sheets

(56) References Cited

U.S. PATENT DOCUMENTS

| | | | |
|---|---|---|---|
| 8,044,496 B2 | 10/2011 | Hsieh | |
| 8,912,664 B1 | 12/2014 | Liou | |
| 8,987,063 B2 | 3/2015 | Harata | |
| 8,999,755 B1 | 4/2015 | Liu | |
| 2001/0005039 A1* | 6/2001 | Russell | H01L 23/4951 257/666 |
| 2003/0151113 A1* | 8/2003 | Hiraga | H01L 23/49805 257/512 |
| 2005/0051877 A1 | 3/2005 | Hsu | |
| 2005/0184825 A1* | 8/2005 | Oran | H01L 23/66 333/33 |
| 2009/0159320 A1* | 6/2009 | Sanjuan | H01L 23/047 174/260 |
| 2012/0051000 A1 | 3/2012 | Laidig | |
| 2012/0208324 A1 | 8/2012 | Harata | |
| 2012/0218729 A1* | 8/2012 | Carey | H01L 21/561 361/807 |
| 2014/0036471 A1 | 2/2014 | Yuen | |

FOREIGN PATENT DOCUMENTS

| | | |
|---|---|---|
| TW | 200625585 | 7/2006 |
| TW | 200939416 | 9/2009 |
| TW | 201010036 A1 | 3/2010 |
| TW | 201338114 A | 9/2013 |

\* cited by examiner

HIGH-FREQUENCY PACKAGE

CROSS REFERENCE TO RELATED APPLICATIONS

This application claims the benefit of U.S. provisional application No. 62/204,972, filed on Aug. 13, 2015 and incorporated herein by reference.

BACKGROUND OF THE INVENTION

1. Field of the Invention

The present invention relates to a high-frequency package, and more particularly, to a high-frequency package capable of reducing high-frequency loss.

2. Description of the Prior Art

Future mobile communication systems and satellite communication systems are usually required to operate at high frequencies. However, a traditional package is not customized for high frequency operation. Significant loss is caused at high frequencies, and degrades performance of the package. In detail, in the traditional package, a wire bonding is performed to connect a die with leads via bonding wires. After the wires are bonded, a molding process is performed. Since the molding compound is usually made of a lossy material, an inductive effect is unavoidable and a serious loss at high frequencies is caused.

For example, please refer to FIGS. 1A-1C, which are schematic diagrams of a sectional side view, a top view and a bottom view of a package 10 in the prior art. In the package 10, a die 100 is bonded on a die pad 102 and connected to leads 104 via bonding wires 106. The bonding wires 106 and the leads 104 would be covered by a molding compound after the molding process, and thus, inductance is formed around the bonding wires 106 and the leads 104. Notably, a top surface of the die 100 is not coplanar with a top surface of the adjacent leads 104, such that the bonding wires 106 is required to be sufficiently long, which causes a significant inductive effect and brings serious loss at high frequencies.

Therefore, it is necessary to improve the prior art.

SUMMARY OF THE INVENTION

It is therefore a primary objective of the present invention to provide a high-frequency package capable of reducing high-frequency loss, to improve over disadvantages of the prior art.

The present invention discloses a high-frequency package. The high-frequency package comprises a ground lead connected to a die, occupying a side of the high-frequency package; and a signal lead comprising at least a protrusion protruding from a central portion of the signal lead; wherein the ground lead and the signal lead perform as a transmission line, and the at least a protrusion forms capacitance of the transmission line.

These and other objectives of the present invention will no doubt become obvious to those of ordinary skill in the art after reading the following detailed description of the preferred embodiment that is illustrated in the various figures and drawings.

DETAILED DESCRIPTION

Figure 1A:
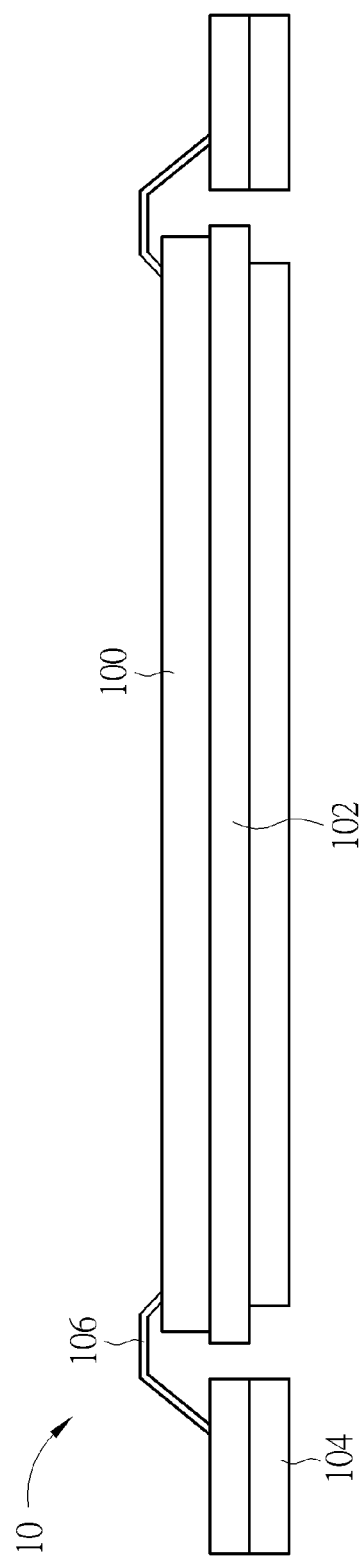
FIGS. 1A-1C are schematic diagrams of a sectional side view, a top view, and a bottom view, respectively, of a package in the prior art.
Figure 1B:
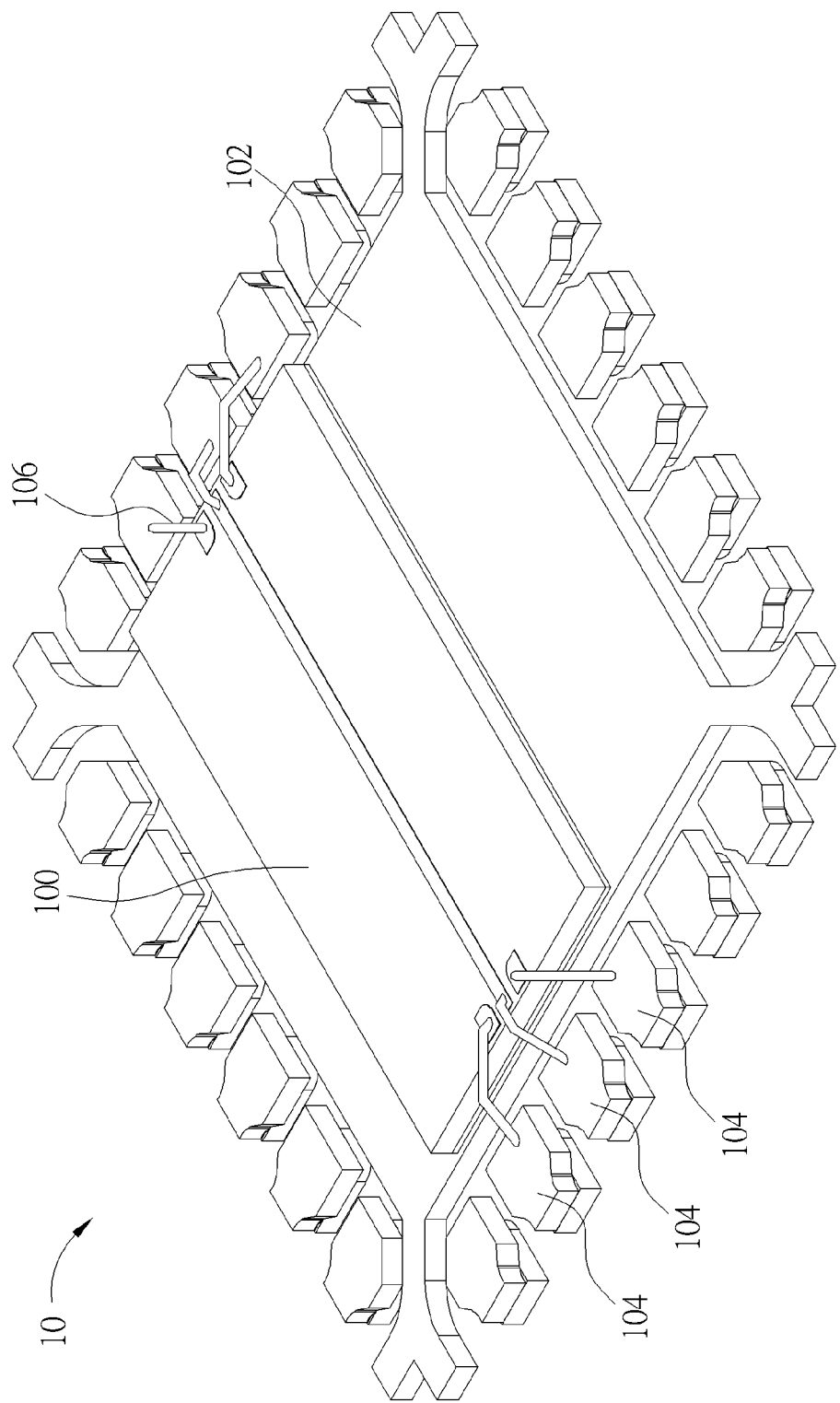
Figure 1C:
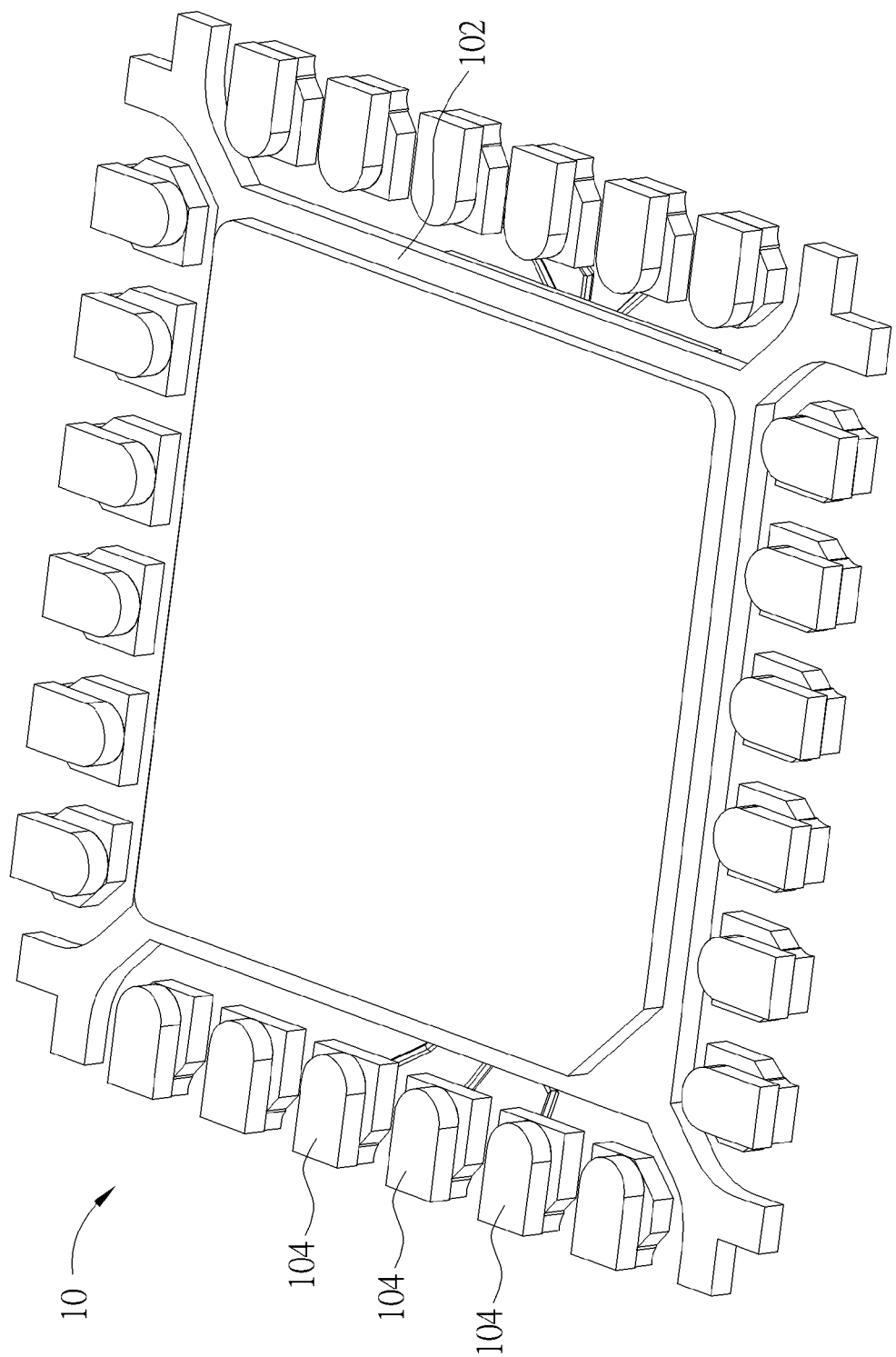
Figure 2:
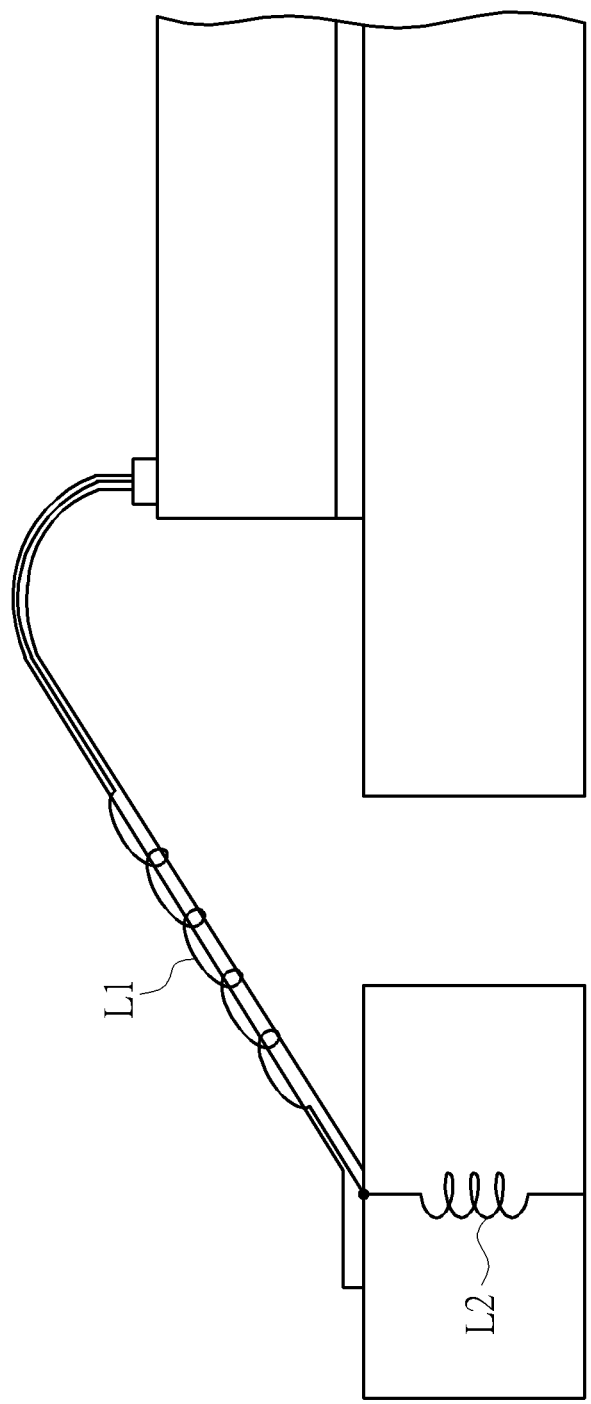
FIG. 2 is a schematic diagram of a circuit model

Inductance formed around the bonding wires and the leads is illustrated in FIG. 2, a schematic diagram of a circuit model of a package. In FIG. 2, an inductance L1 represents an inductance around the bonding wires, and an inductance L2 represents an inductance around the leads. Compensating (or reducing) the inductance effect brought by the inductance L1 and the inductance L2 would alleviate loss at high frequencies and enhance package performance at high frequencies.

Figure 3A:
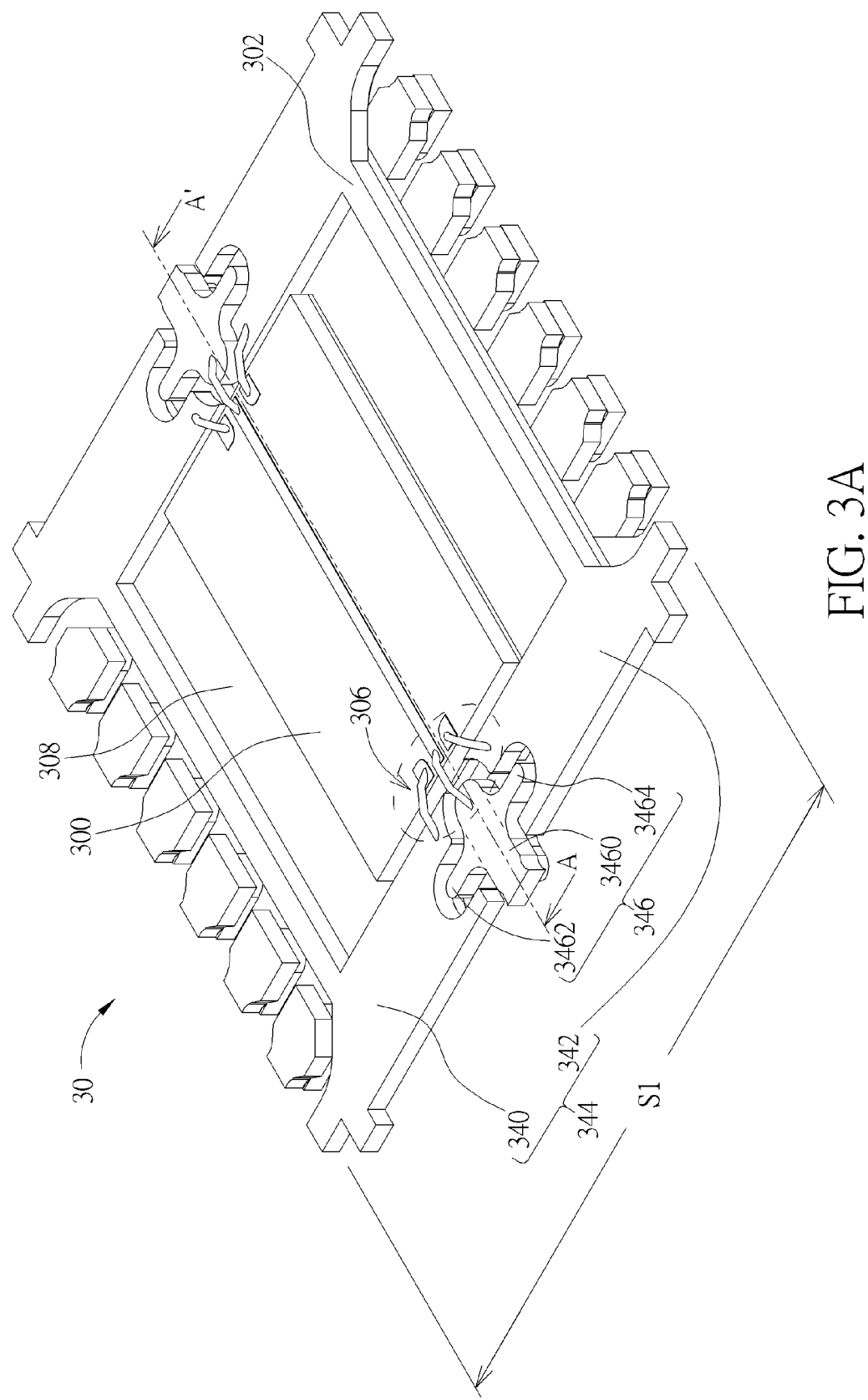
FIGS. 3A and 3B are schematic diagrams of a top view and a sectional side view, respectively, of a high-frequency package according to an embodiment of the present invention.
Figure 3B:
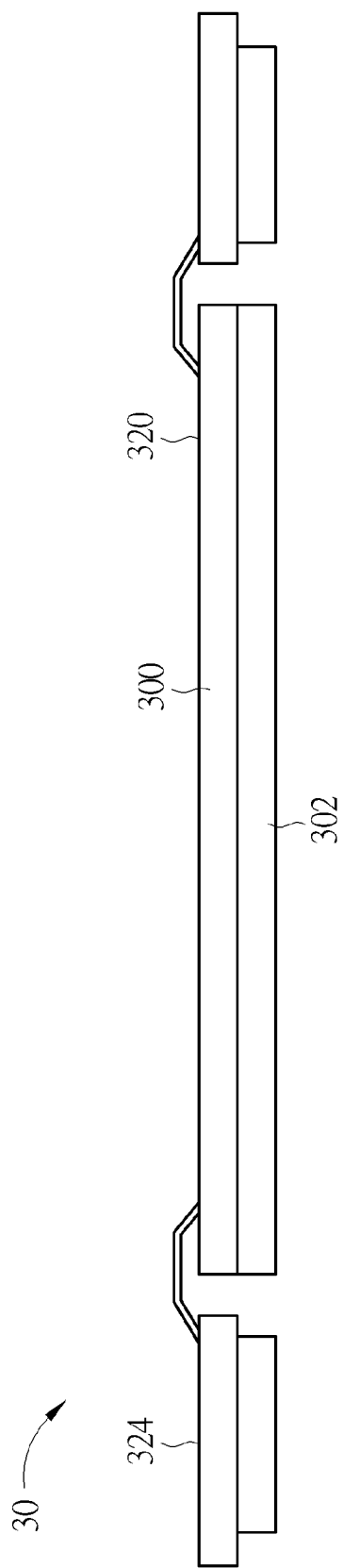

To compensate the inductance effect brought by the inductance L1 and the inductance L2, the leads are designed (or perform) as transmission lines to form capacitance effect. FIGS. 3A and 3B are schematic diagrams of a top view and a sectional side view, respectively, of a high-frequency package 30 according to an embodiment of the present invention, where FIG. 3B illustrates the sectional side view of the high-frequency package 30 along an A-A' line (in FIG. 3A). The high-frequency package 30 comprises a signal lead 346 and a ground lead 344. The signal lead 346 and the ground lead 344 are designed as transmission lines and disposed on a side S1 of the high-frequency package 30. The ground lead 344, occupying the side S1 of the high-frequency package 30, comprises ground segments 340, 342. A hollow area is formed within the ground lead 344, and the ground segments 340, 342 are separated with each other by the hollow area. The signal lead 346 is disposed within the hollow area. The signal lead 346 comprises a central portion 3460 and protrusions 3462, 3464. The protrusions 3462, 3464 protrude from the central portion 3460 of the signal lead 346. A shape of the hollow area varies in corresponding to a shape of the signal lead 346, such that the ground lead 344 is separated from the signal lead 346. In such a situation, the protrusions 3462, 3464 form a capacitance effect of transmission line. The capacitance effect formed by the protrusions 3462, 3464 plays a role of compensating the inductance effect brought by the inductance L1 and the inductance L2, and utilizing the signal lead 346 and the ground lead 344 to perform as transmission line would effectively reduce the inductance L2 around the leads, such that the high-frequency performance of the high-frequency package 30 is enhanced.

In addition, the signal lead 346 is connected to a die 300 via bonding wires 306 and configured to deliver a high frequency signal of the die 300. The ground lead 344 is connected to a ground of the die 300 via the bonding wires 306. Notably, the ground lead 344 connected to the ground of the die 300 is held at a fixed ground voltage while the signal lead 346 delivers the high frequency signal of the die 300. Under a condition that the ground lead 344 surrounds the signal lead 346 (as shown FIG. 3A), the ground lead 344 and the signal lead 346 form as a ground-signal-ground (GSG) structure. Preferably, a top surface of the ground lead 344 and a top surface of the signal lead 346 are at a same horizontal level. That is, the top surface of the ground lead 344 is coplanar (or aligned) with the top surface of the signal lead 346. Therefore, performance of the high-frequency package 30 at high frequencies is enhanced. Furthermore, the bonding wire 306 connecting the die 300 and the ground lead 344 is disposed between the bonding wires 306 connecting the die 300 and the signal lead 346, which means that the bonding wires 306 also form as a GSG structure so as to enhance the high-frequency performance of the high-frequency package 30.

As can been see, utilizing the signal lead 346 and the ground lead 344 to perform as transmission line would effectively reduce the inductance L2 around the leads. Further, forming the capacitance effect of the transmission line using the protrusions 3462, 3464 of the signal lead 346 would compensate the inductance effect brought by the inductance L1 and the inductance L2. Thus, performance of the high-frequency package 30 at high frequencies is enhanced.

In addition, performance of the high-frequency package 30 at high frequencies may be further enhanced by reducing the inductance L1 around the bonding wires. To reduce the inductance L1 around the bonding wires 306, lengths of the bonding wires 306 may be shortened by lowering a horizontal level of a top surface of the die 300. For example, as FIGS. 3A and 3B show, a notched area 308 may be formed on a die pad 302 of the high-frequency package 30, such that after the die 300 is bonded on the die pad 302, a top surface 320 of the die 300 would substantially align with top surfaces 324 of adjacent leads, where the adjacent leads may be the signal lead 346 or the ground lead 344. In general, a difference in horizontal level between the top surface 320 of the die 300 and the top surfaces 324 of the adjacent leads is suggested to be smaller than 60% of a thickness of the die 300. Preferably, the top surface 320 is coplanar (or aligns) with the top surfaces 324. Therefore, the lengths of the bonding wires 306 are shortened, and the inductance L1 is reduced.

Figure 4:
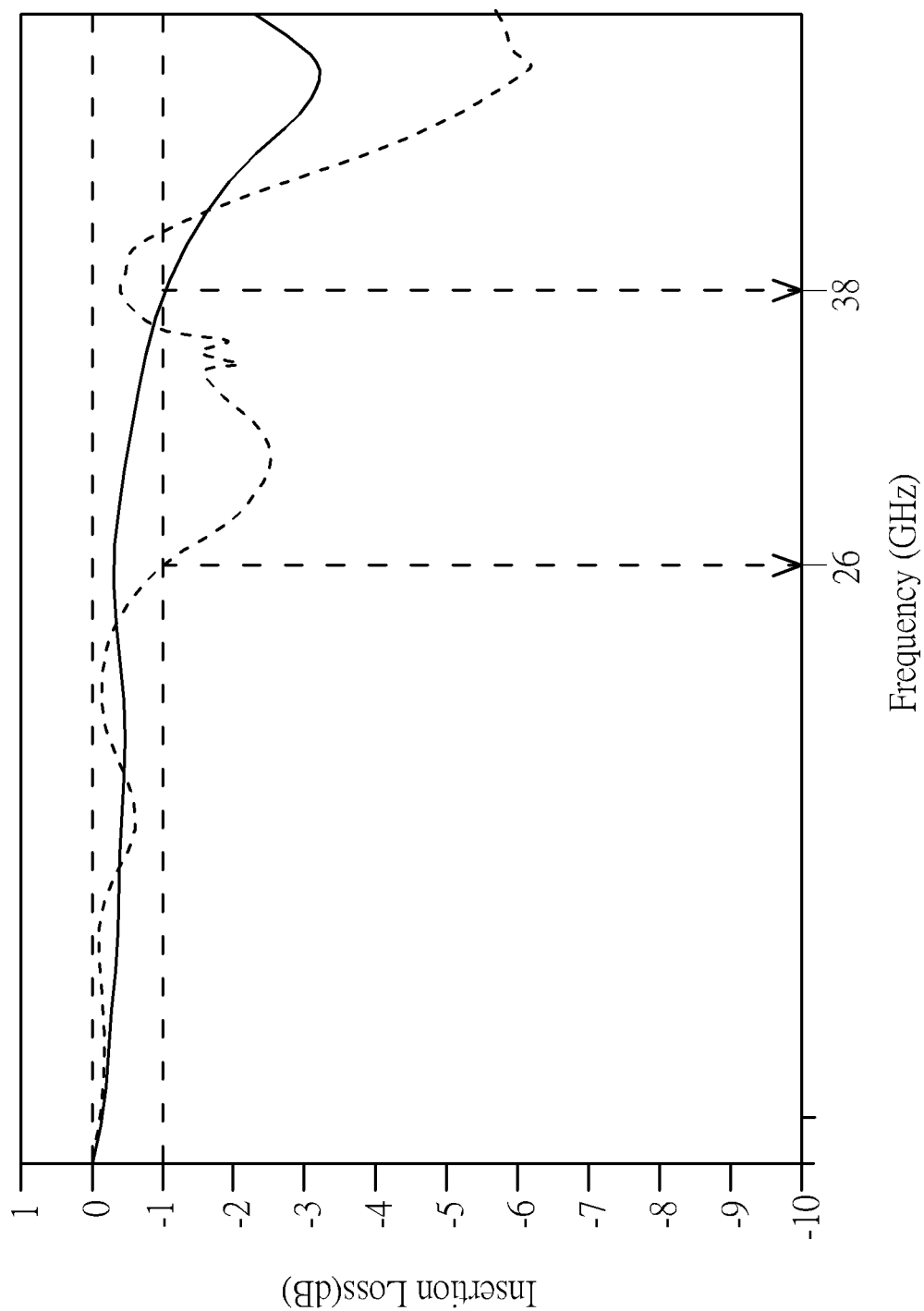
FIG. 4 is a frequency response diagram of transmission coefficient.
Figure 5A:
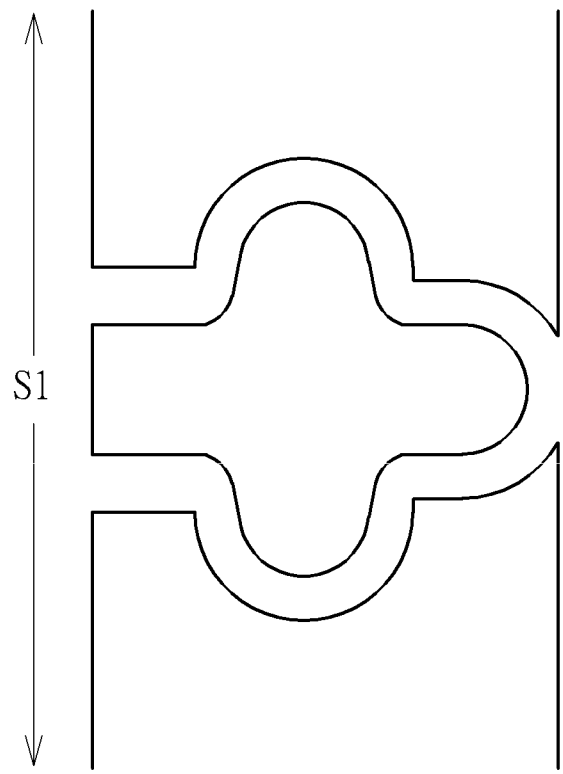
FIGS. 5A-5H are schematic diagrams of signal leads and corresponding ground leads according to embodiments of the present invention.
Figure 5B:
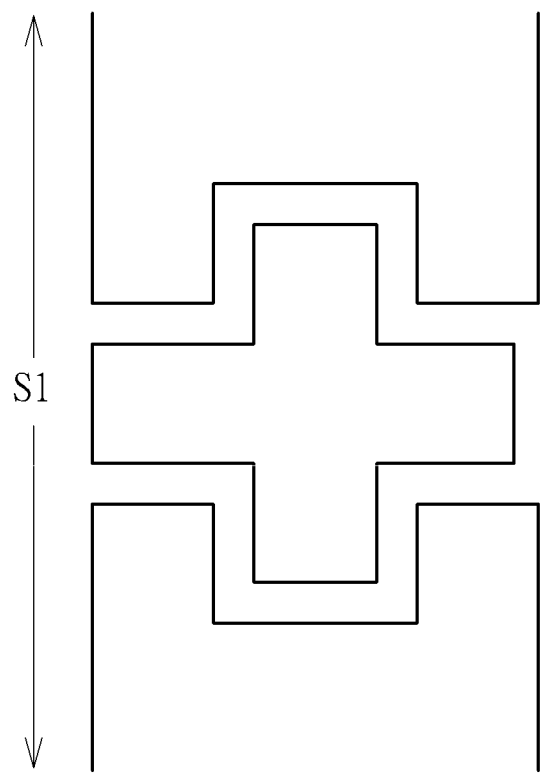
Figure 5C:
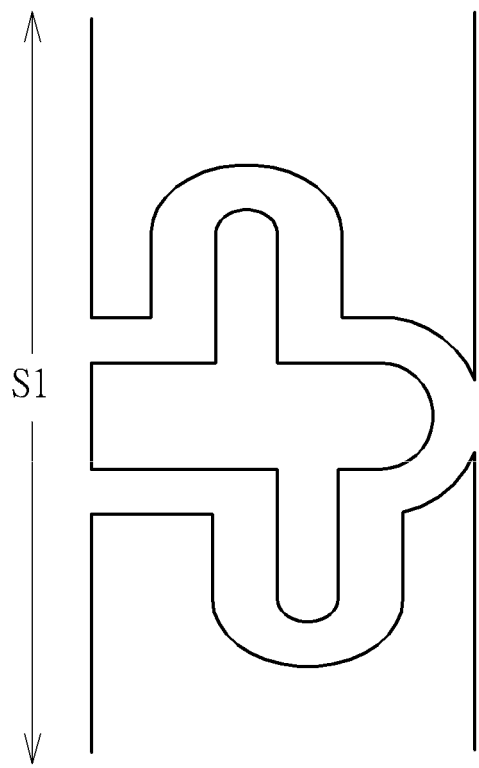
Figure 5D:
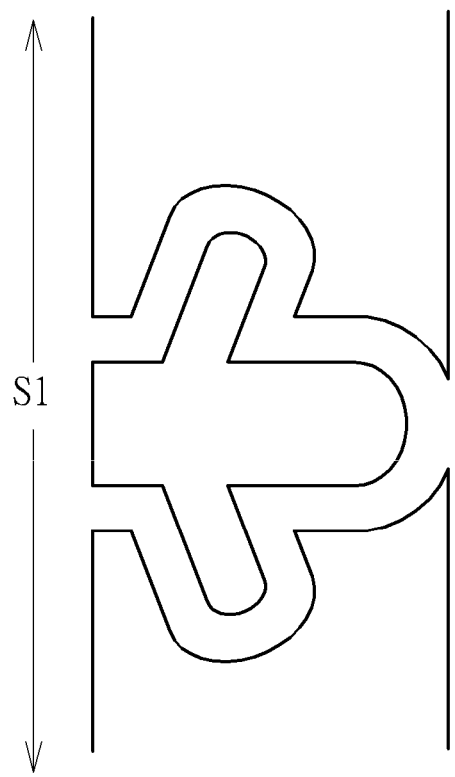
Figure 5E:
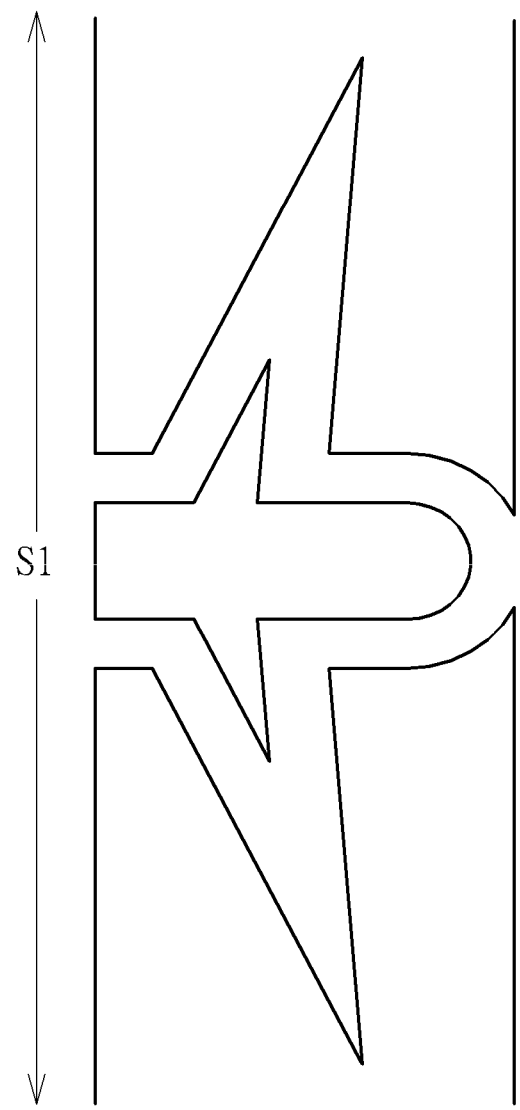
Figure 5F:
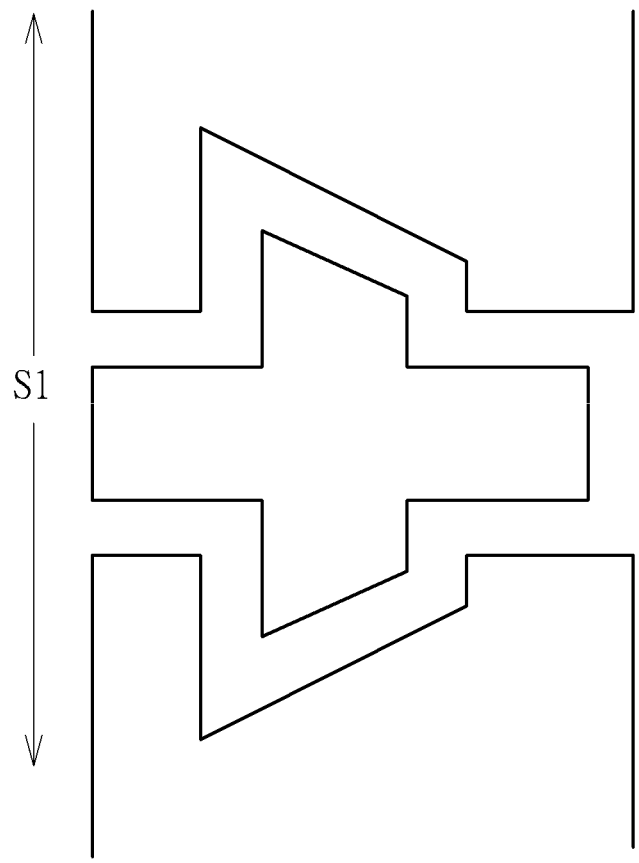
Figure 5G:
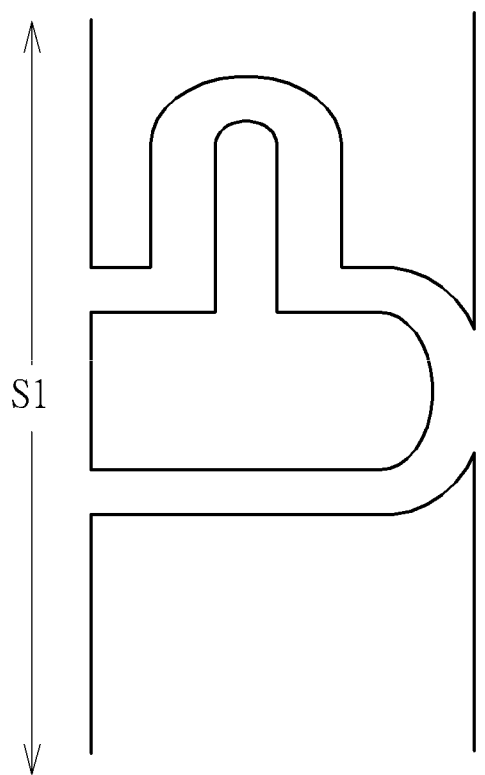
Figure 5H:
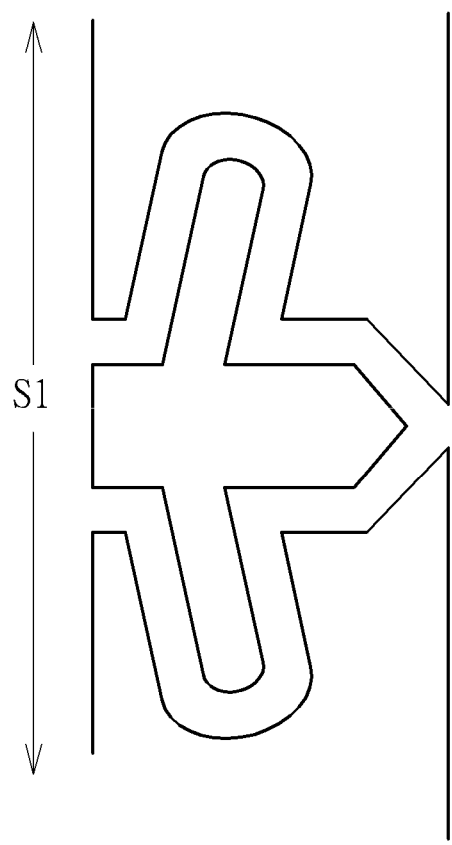

The high-frequency performance of the high-frequency package 30 maybe evaluated by a frequency response diagram of insertion loss (i.e., the scattering parameter $S_{21}$) of the package 10 and the high-frequency package 30, as shown in FIG. 4. In FIG. 4, a dashed line represents the frequency response of insertion loss of the package 10, and a solid line represents that of the high-frequency package 30. As can be seen from FIG. 4, a characteristic frequency (at which the insertion loss is 1 dB) of the package 10 is only 26 GHz. By forming the capacitance of transmission line using the protrusions (to compensate the unavoidable inductance) and shortening the bonding wires, a characteristic frequency of the high-frequency package 30 is significantly improved to approach 38 GHz. In addition, ripples in frequency response under the characteristic frequency of the high-frequency package 30 are minor than the package 10, which benefits an operation of the high-frequency package 30.

Notably, the embodiments stated in the above are utilized for illustrating the concept of the present invention. Those skilled in the art may make modifications and alternations accordingly, and not limited herein. For example, methods of forming the notched area are not limited. The notched area is formed by either topside etching or backside etching, and not limited herein. In addition, the signal lead and the ground lead may be realized using microstrip line or coplanar waveguide, and not limited herein.

In addition, the die pad 302 is not limited to having the notched area 308 formed therein. The die pad may be downset. As long as the surface 328 of the die pad is lower than the top surfaces 324 of the leads 304 such that the top surface 320 of the die 300 is substantially aligned (coplanar) with the top surfaces 324 of the leads 304, the requirements of the present invention is satisfied.

In addition, a shape of the signal lead is not limited. The shape of the signal lead may be modified according to the practical situation. For example, please refer to FIGS. 5A-5H, which are schematic diagrams of signal leads and corresponding ground leads according to embodiments of the present invention. As shown in FIGS. 5A-5H, the shape of the protrusion of the signal lead may be semicircle, rectangular, triangular, trapezoidal, etc. The protrusion may protrude from the central portion of the signal lead unilaterally or bilaterally. In addition, the protrusion may protrude from the central portion of the signal lead symmetrically or asymmetrically. As long as the corresponding ground lead surrounds the signal lead and separates from the signal lead, the signal lead and the ground lead are within the scope of the present invention.

In summary, the signal lead of the present invention includes the protrusions to form capacitance effect for compensating the inductance effect brought by the inductance L1 and the inductance L2. In addition, the notched area is formed on the die pad, so to align the top surface of the die with the top surface of the leads, shorten the lengths of the bonding wires, and reduce the inductance L1. Thus, performance of the high-frequency package is improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high-frequency package, comprising:
 a ground lead, connected to a die, wherein a hollow area is formed within the ground lead; and
 a signal lead, connected to the die and disposed within the hollow area, comprising at least a protrusion protruding from a central portion of the signal lead, wherein a protrusion of the at least a protrusion is between a first edge and a second edge of the central portion, and the first edge and the second edge are both at a first side of the central portion of the signal lead and perpendicular to a side of the high-frequency package;
 wherein the ground lead and the signal lead perform as a transmission line, and the at least a protrusion forms capacitance of the transmission line;
 wherein a first shape of the hollow area is the same as a second shape of the signal lead.

2. The high-frequency package of claim 1, wherein the ground lead occupies the entire side of the high-frequency package.

3. The high-frequency package of claim 1, wherein the ground lead surrounds the signal lead such that the ground lead and the signal lead form as a ground-signal-ground structure.

4. The high-frequency package of claim 1, wherein a top surface of the ground lead and a top surface of the signal lead is at a same level.

5. The high-frequency package of claim 1, wherein the ground lead comprises a first ground segment and a second ground segment, and the first ground segment and the second ground segment are separated by the hollow area.

6. The high-frequency package of claim 1, further comprising:
 a die pad, wherein a surface of the die pad is lower than top surfaces of the plurality of leads;
 wherein the die is disposed on the die pad.

7. The high-frequency package of claim 6, wherein a level difference is smaller than a specific value, and the level difference is a difference in level between the top surface of the die and the top surfaces of the ground lead and the signal lead.

8. The high-frequency package of claim 7, wherein the specific value is 60% of a thickness of the die.

9. The high-frequency package of claim 6, further comprising:
 a plurality of bonding wires;
 wherein the ground lead and the signal lead are connected to the die via the plurality of bonding wires, and the die is disposed on the die pad.

10. The high-frequency package of claim 9, wherein the plurality of bonding wires form as a ground-signal-ground structure.

11. The high-frequency package of claim 6, wherein the die pad comprises a notched area with a notched depth, and the die is disposed within the notched area.

12. The high-frequency package of claim 1, wherein the ground lead comprises a first edge adjacent to the hollow area, and the first edge surrounds the signal lead along with a second shape of the signal lead within the hollow area.

13. The high-frequency package of claim 1, wherein a gap, between the ground lead and the signal lead within the hollow area, has a constant width within the high-frequency package.

14. The high-frequency package of claim 1, wherein the at least a protrusion protrude toward a first direction and protrude from a center of the central portion of the signal lead, and the center of the central portion is between the first edge and the second edge.

15. The high-frequency package of claim 14, wherein the first direction is parallel to the side of the high-frequency package.

16. The high-frequency package of claim 1, wherein the signal lead comprises a plurality of protrusions protruding from the central portion of the signal lead, and the plurality of protrusions form capacitance of the transmission line.

* * * * *